US010446620B2

(12) United States Patent
Jun et al.

(10) Patent No.: US 10,446,620 B2
(45) Date of Patent: Oct. 15, 2019

(54) ORGANIC LIGHT-EMITTING DISPLAY DEVICE

(71) Applicant: LG Display Co., Ltd., Seoul (KR)

(72) Inventors: Changhwa Jun, Paju-si (KR); Howon Choi, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/015,638

(22) Filed: Jun. 22, 2018

(65) Prior Publication Data

US 2019/0006430 A1 Jan. 3, 2019

(30) Foreign Application Priority Data

Jun. 30, 2017 (KR) .................. 10-2017-0083889

(51) Int. Cl.
H01L 27/32 (2006.01)
G09G 3/3291 (2016.01)
G09G 3/3258 (2016.01)
H01L 51/52 (2006.01)
G09G 3/3233 (2016.01)

(52) U.S. Cl.
CPC ....... H01L 27/3218 (2013.01); G09G 3/3233 (2013.01); G09G 3/3258 (2013.01); G09G 3/3291 (2013.01); H01L 27/322 (2013.01); H01L 27/3213 (2013.01); H01L 27/3216 (2013.01); H01L 27/3246 (2013.01); H01L 27/3262 (2013.01); H01L 27/3276 (2013.01); H01L 51/5206 (2013.01); H01L 51/5221 (2013.01); G09G 2300/0452 (2013.01); G09G 2310/08 (2013.01); H01L 2251/5307 (2013.01)

(58) Field of Classification Search
CPC .............. H01L 27/322; H01L 27/3213; H01L 27/3216; H01L 27/3218; G09G 2300/0452
See application file for complete search history.

(56) References Cited

U.S. PATENT DOCUMENTS

2007/0108899 A1* 5/2007 Jung ................... H01L 27/3276 313/506
2015/0015466 A1* 1/2015 Feng .................... G09G 3/2003 345/77
2017/0308194 A1* 10/2017 Guard .................... G06F 3/044

* cited by examiner

Primary Examiner — Feifei Yeung Lopez
(74) Attorney, Agent, or Firm — Seed IP Law Group LLP

(57) ABSTRACT

An organic light-emitting diode display device is disclosed. The organic light-emitting diode display device comprises a display panel where a plurality of pixels are arranged. The plurality of pixels comprise a first pixel having a first planar shape consisting of a plurality of points and a second pixel placed adjacent to the first pixel and having a second planar shape consisting of a plurality of points. The first planar shape contains a first point, which is the only point from which the shortest distance between the first pixel and the second pixel is obtained.

2 Claims, 14 Drawing Sheets

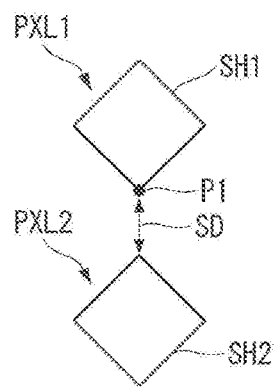
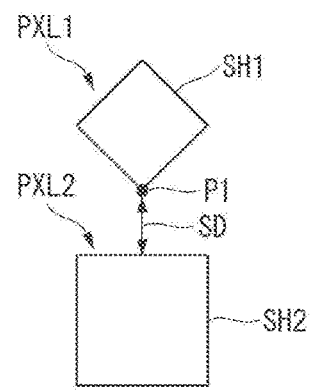
*Fig. 6A*  *Fig. 6B*
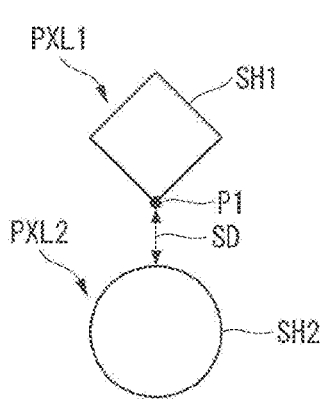
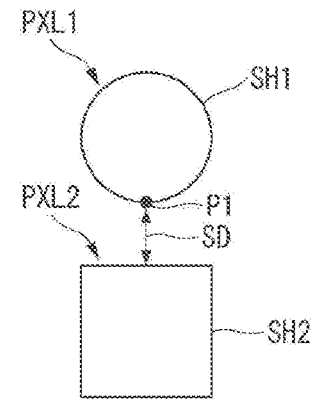
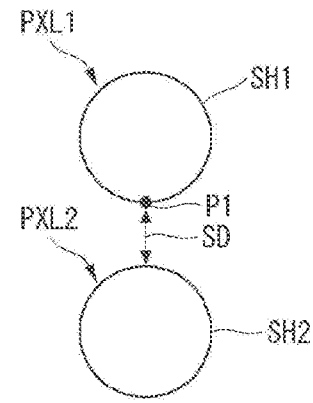
*Fig. 6C*  *Fig. 6D*  *Fig. 6E*

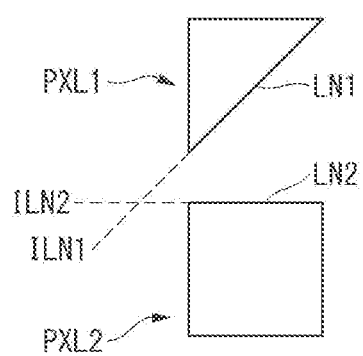 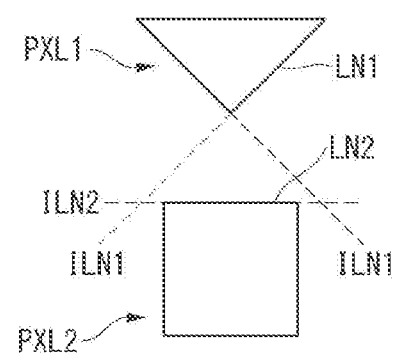
*Fig. 8A*  *Fig. 8B*

ORGANIC LIGHT-EMITTING DISPLAY DEVICE

CROSS-REFERENCE TO RELATED APPLICATIONS

This application claims the priority benefit of Korean Patent Application No. 10-2017-0083889 filed on Jun. 30, 2017, which is incorporated herein by reference for all purposes as if fully set forth herein.

BACKGROUND

Technical Field

The present disclosure relates to an organic light-emitting diode display device.

Description of the Related Art

Recently, various display devices that are less bulky and more lightweight than cathode ray tubes (CRTs) are being developed. Examples of the display devices include liquid crystal displays (LCDs), field emission displays (FEDs), plasma display panels (PDPs), organic light-emitting diode displays (OLEDs), etc.

Among these types of display devices, the organic light-emitting diode displays are self-luminous displays that emit light through excitation of organic compounds. In contrast to LCDs, the organic light-emitting diode displays work without a backlight; thus, organic light-emitting diode displays can be lighter and thinner and made in a simplified process. Also, the organic light-emitting diode displays are widely used because they can be manufactured at low temperatures, have a fast response time of 1 ms or less, and feature low power consumption, wide viewing angle, and high contrast.

An organic light-emitting diode display comprises an organic light-emitting diode that converts electrical energy into light energy. The organic light-emitting diode comprises an anode, a cathode, and an organic emission layer situated between the anode and cathode. Holes and electrons are injected from the anode and cathode, respectively, and they recombine to form excitons, whereby an image is displayed when the excitons fall from the excited state to the ground state.

The organic emission layer may comprise red (R), green (G), and blue (B) organic emission layers. They may be formed in corresponding red (R), green (G), and blue (B) pixels, respectively. A fine metal mask (FMM) is typically used to pattern the red (R), green (G), and blue (B) pixels. However, even with the dramatic advances in the processing technology, there are limitations in using the FMM to make high-resolution displays. As a matter of fact, when the FMM is used to realize resolution above 1,000 PPI, it is currently hard to achieve a process yield of more than a certain level.

Moreover, a large-area, high-resolution display device requires a corresponding large-area FMM. The larger the area of the mask, the more the center will sag under the weight, which leads to various defects such as displacement of the organic emission layer.

BRIEF SUMMARY

The present disclosure has been made in an effort to solve the above-mentioned problems and to provide a high-resolution organic light-emitting diode display device that improves color reproduction.

An organic light-emitting diode display device comprises a display panel where a plurality of pixels are arranged. The plurality of pixels comprise a first pixel having a first planar shape consisting of a plurality of points and a second pixel placed adjacent to the first pixel and having a second planar shape consisting of a plurality of points. The first planar shape contains a first point, which is the only point from which the shortest distance between the first pixel and the second pixel is obtained.

In another aspect, an organic light-emitting diode display device comprises a display panel where X and Y axes intersecting each other are defined. The display panel comprises a first pixel having a first planar shape containing a (1-1)th side, a (1-2)th side, a (1-3)th side, and a (1-4)th side that intersect the X and Y axes; and a second pixel having a second planar shape containing a (2-1)th side and a (2-3)th side that are parallel to the X axis and a (2-2)th side and a (2-4)th side that are parallel to the Y axis. The (1-1)th side and the (1-2)th side face the (2-1)th side. A (1-1)th imaginary line extending from the (1-1)th side and a (1-2)th imaginary line extending from the (1-2)th side intersect a second imaginary line extending from the (2-1)th side.

In another aspect, an organic light-emitting diode display device comprises a display panel where X and Y axes intersecting each other are defined. The display panel comprises a first pixel having a first planar shape in which any three points not on a single line are contained; and a second pixel having a second planar shape in which any three points not on a single line are contained. The first planar shape being a polygon having a (1-1)th side and a (1-2)th side that intersect the X and Y axes. The second planar shape being a polygon having a (2-1)th side that is parallel to the X axis. The (1-1)th side and the (1-2)th side face the (2-1)th side. a (1-1)th imaginary line extending from the (1-1)th side and a (1-2)th imaginary line extending from the (1-2)th side intersect a second imaginary line extending from the (2-1)th side.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 6A to 10B are views showing examples of the shape and arrangement of pixels in an organic light-emitting diode display device according to an exemplary embodiment of the present disclosure.

DETAILED DESCRIPTION

Figure 1:
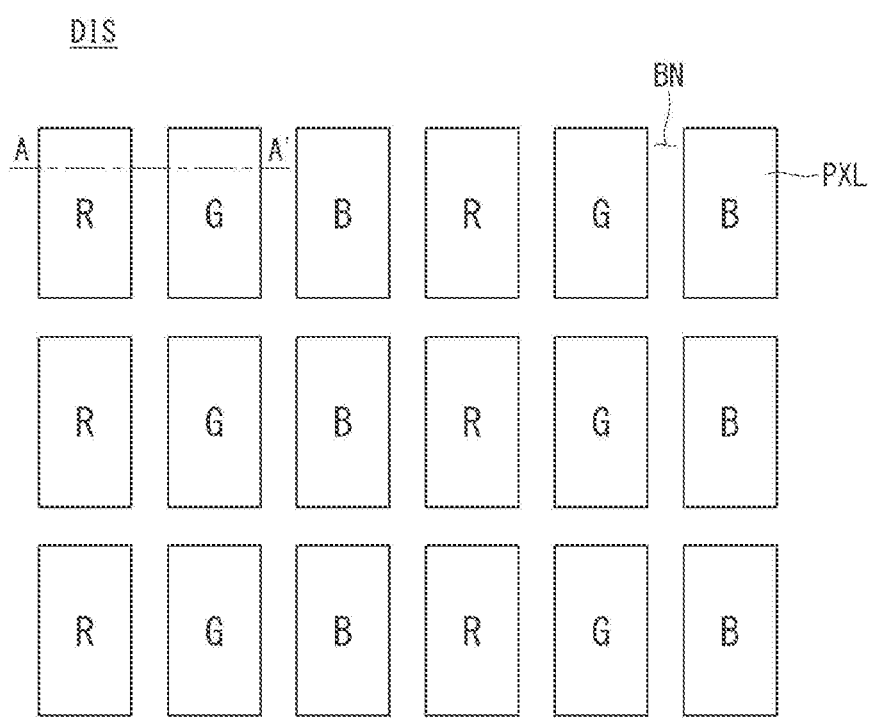
FIGS. 1, 2A and 2B are a plan view and cross-sectional views of an organic light-emitting diode display device.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. The same elements are given the same reference numerals in various embodiments, and they will be typically described in a first embodiment, and will be omitted in the other embodiments.

It will be understood that, although the terms "first", "second", etc. may be used herein to describe various elements, these elements are not limited by these terms. These terms are used to distinguish one element from another element.

Figure 2A:
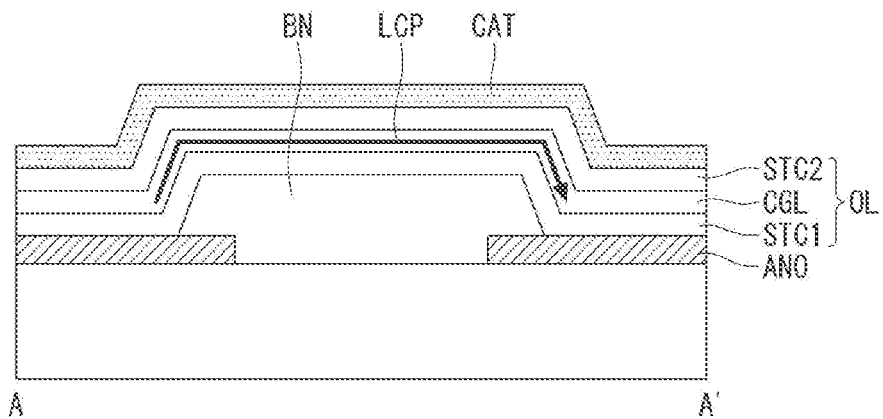
Figure 2B:
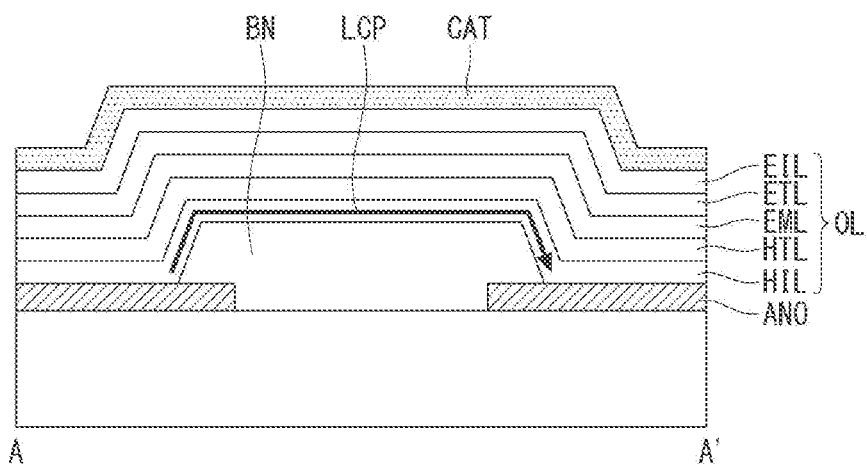

FIGS. 1 and 2A and 2B are a plan view and cross-sectional views of an organic light-emitting diode display device.

Referring to FIG. 1, the organic light-emitting diode display device comprises a display panel DIS having a plurality of pixels PXL. The display panel DIS may have various shapes. That is, the plane of the display panel DIS may be rectangular or square, and also may have various free-form shapes, such as a circle, an ellipse, or a polygon. X and Y axes intersecting at right angles regardless of the shape of the display panel DIS are defined on the display panel DIS. By the X- and Y-axes, the shape of subpixels PXL to be described later may be defined.

The display panel DIS comprises rectangular pixels PXL arranged in a matrix. That is, each pixel PXL has a planar shape containing two sides parallel to the X-axis and two sides parallel to the Y-axis. Although described later, neighboring pixels PXL may be sectioned off by a bank BN (or pixel defining layer), and the planar shape of each pixel PXL may be defined by the bank BN. Thus, the position and shape of the bank BN may be properly selected so that the pixels PXL have a preset planar shape.

The display panel DIS comprises red (R), blue (B), and green (G) pixels PXL that emit light red (R), blue (B), and green (G) light, respectively. If required, the display panel DIS may further comprise pixels PXL that emit light of another color, such as white (W). For ease of explanation, a description will be given below with respect to a display panel DIS comprising red (R), blue (B), and green (G) pixels PXL, for example.

The organic light-emitting diode display device according to the present disclosure comprises an organic emission layer OL that emits white light (W) and red (R), blue (B), and green (G) color filters, in order to produce red (R), blue (B), and green (G) colors. That is, the organic light-emitting diode display device may produce red (R), green (G), and blue (B) colors as the white light (W) emitted from the organic emission layer OL passes through the red (R), green (G), and blue (B) color filters corresponding to the red (R), green (G), and blue (B) pixels PXL.

In the organic light-emitting diode display device according to the present disclosure, the organic emission layer OL emitting white light (W) is made wide enough to cover most of the entire surface of the panel, so there is no need to use FMM to allocate red (R), blue (B), and green (G) organic emission layers OL to the corresponding pixels PXL, respectively. Thus, the present disclosure has the advantage of avoiding problems with the use of the aforementioned FMM—for example, a decrease in process yield associated with high resolution and an alignment error which causes displacement of the organic emission layer OL.

Using the aforementioned method, the present disclosure may provide a display device that minimizes the decrease in process yield and has high resolution. But, the thing is that light may be emitted from unwanted pixels PXL due to a leakage current through the organic emission layer OL formed widely across every pixel PXL, and this may lead to color mixing between neighboring pixels PXL. Here, at least one layer that makes up the organic emission layer OL and has high conductivity may serve as a leakage current flow path LCP (in FIG. 2A).

In an example, referring to FIG. 2A, the organic emission layer OL emitting white light (W) may have a multi-stack structure such as a two-stack structure. The two-stack structure may comprise a charge generation layer CGL situated between anode ANO and cathode CAT, and a first stack STC1 and a second stack STC2 that are located under and over the charge generation layer CGL sandwiched between them. The first stack STC1 and the second stack STC2 each comprise an emission layer, and may further comprise at least one of common layers such as a hole injection layer, a hole transport layer, an electron transport layer, and an electron injection layer. The emission layer of the first stack STC1 and the emission layer of the second stack STC2 may comprise light-emitting materials of different colors. One of the emission layers of the first stack STC1 and second stack STC2 comprises, but not limited to, a blue light-emitting material, and the other may comprise, but not limited to, a yellow light-emitting material.

Since the aforementioned organic emission layer OL, especially, the charge generation layer CGL, is not patterned into individual parts for each pixel PXL but instead is formed widely, part of the current generated while the display device stays on may leak through the charge generation layer CGL. Due to the leakage current, light is emitted from pixels PXL that are not required to emit light, and this results in a significant degradation in color reproduction range.

In another example, referring to FIG. 2A, the organic emission layer OL emitting white light (W) may have a single-stack structure. Each single stack comprises an emission layer EML, and may further comprise at least one of common layers such as a hole injection layer HIL, a hole transport layer HTL, an electron transport layer ETL, and an electron injection layer EIL.

Since the aforementioned organic emission layer OL, especially, the hole injection layer HIL, is not patterned into individual parts for each pixel PXL but instead is formed widely, part of the current generated while the display device stays on may leak through the hole injection layer CGL. Due to the leakage current, light is emitted from pixels PXL that are not required to emit light, and this results in a significant degradation in color reproduction range.

The aforementioned problem becomes more severe in high-resolution display devices which have a relatively small pixel pitch (or a distance between neighboring pixels). That is, although neighboring pixels PXL are sectioned off by a bank BN or the like and spaced by a predetermined pitch, higher-resolution display devices have a much smaller pixel pitch, and therefore the color mixing caused by leakage current will occur more often. Hence, there is a need to minimize the flow of leakage current in order to prevent degradation in the display quality of a high-resolution display device.

To solve this problem, an exemplary embodiment of the present disclosure provides a method and structure for effectively suppressing the flow of leakage current by controlling the spatial area between neighboring pixels PXL.

Exemplary Embodiment

Figure 3:
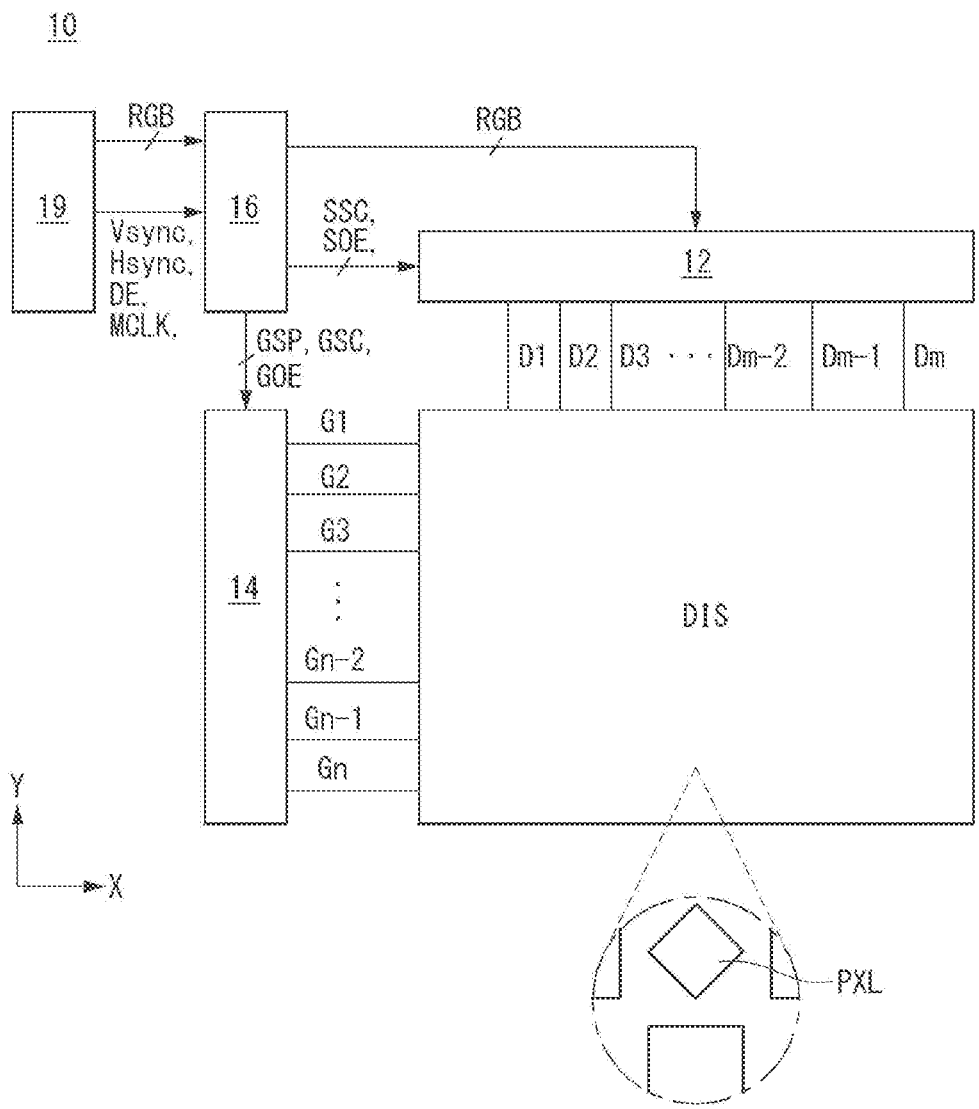
FIG. 3 is a schematic block diagram of an organic light-emitting diode display device according to an exemplary embodiment of the present disclosure.
Figure 4:
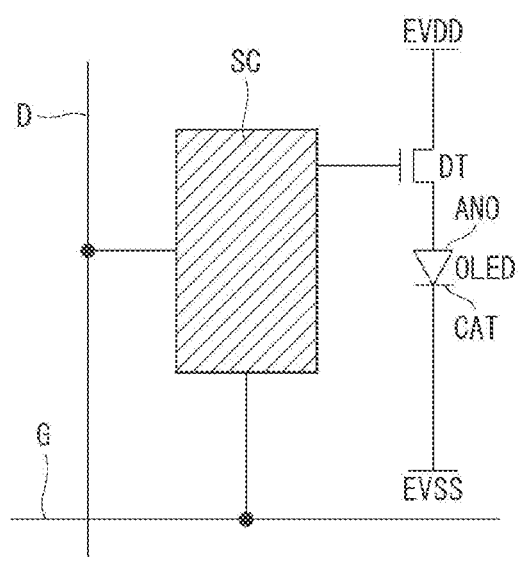
FIG. 4 is a schematic diagram of a pixel shown in FIG. 3.

FIG. 3 is a schematic block diagram of an organic light-emitting diode display device according to an exemplary embodiment of the present disclosure. FIG. 4 is a schematic diagram of a pixel shown in FIG. 3. FIG. 5 is views showing an exemplary embodiment of a pixel circuit.

Referring to FIG. 3, the organic light-emitting diode display device 10 according to the present disclosure comprises a display drive circuit and a display panel DIS.

The display drive circuit comprises a data drive circuit 12, a gate drive circuit 14, and a timing controller 16 and writes vides data voltages of an input image to the pixels PXL on the display panel DIS. The data drive circuit 12 converts digital video data RGB inputted from the timing controller 16 into analog gamma-compensated voltages to generate data voltages. The data voltages outputted from the data drive circuit 12 are supplied to data lines D1 to Dm. The gate drive circuit 14 sequentially supplies gate signals to gate lines G1 to Gn in synchronization with the data voltages and selects pixels PXL from the display panel DIS to write the data voltages to.

The timing controller 16 receives, from a host system 19, timing signals such as a vertical synchronization signal Vsync, a horizontal synchronization signal Hsync, a data enable signal DE, and a main clock MCLK, and synchronizes the operation timings of the data drive circuit 12 and gate drive circuit 14 with each other. A data timing control signal for controlling the data drive circuit 12 comprises a source sampling clock (SSC), a source output enable signal (SOE), etc. A gate timing control signal for controlling the gate drive circuit 14 comprises a gate start pulse (GSP), a gate shift clock (GSC), a gate output enable signal (GOE), etc.

The host system 19 may be any one of the following: a television system, a set-top box, a navigation system, a DVD player, a Blu-ray player, a personal computer PC, a home theater system, and a phone system. The host system 19 comprises a system-on-chip (SoC) having a scaler incorporated in it, and converts digital video data RGB of an input image into a format suitable for display on the display panel DIS. The host system 19 sends timing signals Vsync, Hsync, DE, and MCLK, along with the digital video data, to the timing controller 16.

The display panel DIS may have various shapes. That is, the plane of the display panel DIS may be rectangular or square, and also may have various free-form shapes, such as a circle, an ellipse, or a polygon.

The display panel DIS comprises a pixel array PXL. The pixel array PXL comprises a plurality of pixels PXL. The pixels PXL may be defined by, but not limited to, the intersections of the data lines D1 to Dm (m is a positive integer) and the gate lines G1 to Gn (n is a positive integer).

Each pixel PXL comprises an organic light-emitting diode (hereinafter, OLED) which is a self-luminous element. The display panel DIS comprises red (R), blue (B), and green (G) pixels PXL that emit red (R), green (B), and green (G) light.

The pixels PXL may have various shapes. That is, the plane of the pixels PXL may have various shapes, such as circular, elliptical, or polygonal. One of the pixels PXL may have a different planar shape from another.

Referring to FIG. 4, a plurality of data lines D and a plurality of gate lines G intersect on the display panel DIS, and pixels PXL may be arranged in a matrix at the intersections. Each pixel PXL comprises an organic light-emitting diode OLED, a driving thin-film transistor DT that controls the amount of current flowing through the organic light-emitting diode OLED, and a programming part SC for setting the gate-source voltage of the driving thin-film transistor DT.

The programming part SC may comprise at least one switching thin-film transistor and at least one storage capacitor. The switching thin-film transistor turns on in response to a gate signal from a gate line G to apply a data voltage from a data line D to one electrode of the storage capacitor. The driving thin-film transistor DT adjusts the amount of light emitted from the organic light-emitting diode OLED by controlling the amount of current supplied to the organic light-emitting diode OLED depending on the magnitude of voltage stored in the storage capacitor. The amount of light emitted from the organic light-emitting diode OLED is proportional to the amount of current supplied from the driving thin-film transistor DT. Such a pixel PXL is connected to a high-level voltage source Evdd and a low-level voltage source Evss to receive high-level power supply voltage and low-level power supply voltage from a power generating part (not shown). The thin-film transistors of the pixel PXL may be implemented as p-type or n-type. Moreover, semiconductor layers of the thin-film transistors of the pixel PXL may contain amorphous silicon, polysilicon, or oxide. A description will be given below with respect to a semiconductor layer that contains oxide. The organic light-emitting diode OLED comprises a cathode ANO, a cathode CAT, and an organic emission layer sandwiched between the anode ANO and cathode CAT. The anode ANO is connected to the driving thin-film transistor DT.

Figure 5A:
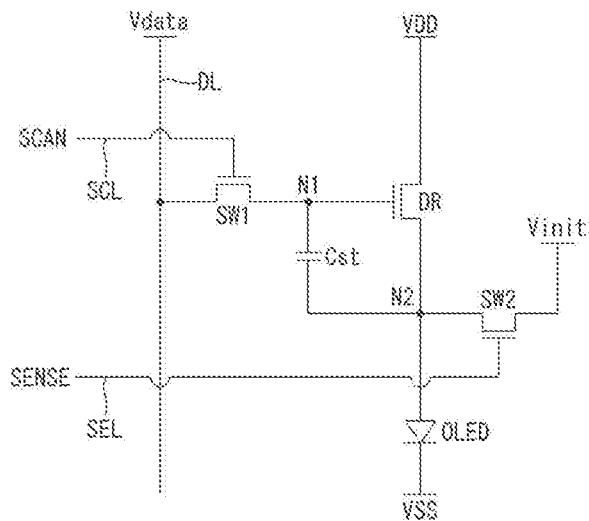
FIGS. 5A and 5B are views showing an exemplary embodiment of a pixel circuit.

Referring to FIG. 5A, a pixel according to an exemplary embodiment comprises a driving thin-film transistor DT, first and second switching transistors ST1 and ST2, and a capacitor Cst. The organic light-emitting diode OLED works in such a way as to emit light by a drive current formed by the driving-thin film transistor DR. The first switching transistor ST1 supplies a data voltage Vdata to a first node N1 through a data line DL, in response to a gate signal SCAN supplied through a gate line SCL. The driving thin-film transistor DT works in such a way that drive current flows between a high-level power supply line VDD and a low-level power supply line VSS by the data voltage stored in the capacitor Cst. The second switching transistor ST2 connects a second node N2 and an initial line, in response to a sense signal SENSE supplied through a sense line SEL. The initial line may be connected to an input terminal of initial voltage Vinit or connected to an analog-to-digital converter ADC obtains a sensed value of the threshold voltage of the driving thin-film transistor DT.

Figure 5B:
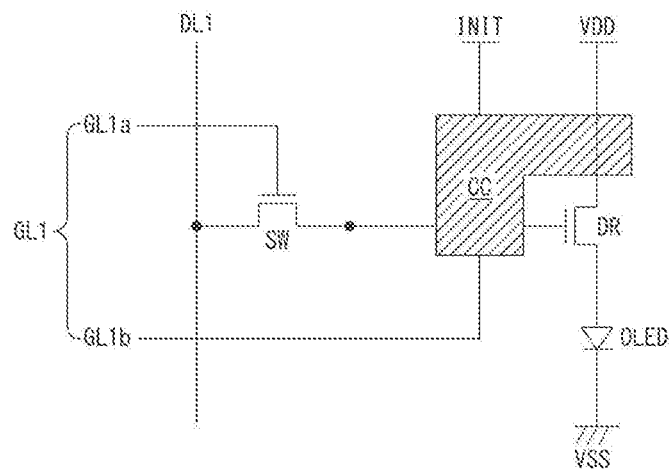

As shown in FIG. 5B, the pixel PXL may comprise an internal compensation circuit CC. The internal compensation circuit CC may comprise one or more transistors. To this end, the gate line GL1 comprises a signal line GL1b that supplies gate signals for controlling the transistors in the internal compensation circuit CC. The gate line GL1 may further comprise a signal line GL1a that controls the switching transistor SW. The internal compensation circuit CC sets the gate-source voltage of the driving thin-film transistor DR to a voltage that reflects variation in threshold voltage, so as to cancel out any brightness variation caused by the threshold voltage of the driving thin-film transistor DR when the organic light-emitting diode OLED emits light.

The pixel structure of the present disclosure is not limited to the above, but may vary, including 2T (transistor) 1C (capacitor), 3T2C, 4T2C, 5T1C, 6T2C, and 7T2C.

FIGS. 6 to 10 are views showing examples of the shape and arrangement of pixels in an organic light-emitting diode display device according to an exemplary embodiment of the present disclosure.

Referring to FIG. 6, the display panel DIS comprises a first pixel PXL1 and a second pixel PXL2 placed adjacent to each other. The first pixel PXL1 and second pixel PXL2 have a predetermined planar shape formed by joining points and lines. That is, the first pixel PXL1 has a first planar shape SH1 comprised of a plurality of points, and the second pixel PXL2 has a second planar shape SH2 comprised of a plurality of points. In other words, the first pixel PXL1 has a first planar shape SH1 in which there are at least three points not on a single straight line, and the second pixel PXL2 has a second planar shape SH2 in which there are at least three points not on a single straight line. The first planar shape SH1 and the second planar shape SH2 each have a predetermined length and a predetermined width. Thus, even if the shape of the pixel is round, as shown in FIG. 6A, it contains a number of points that are not on a single, straight line. Thus, it is comprised of a number of points. Of course, a straight line is made up of a number of points, therefore, the top line of square pixel SH2 in FIG. 6D is comprised of a number of points, all them being on the same single straight line.

The first pixel PXL1 and the second pixel PXL2 are arranged under the following condition:

The first planar shape SH1 contains a first point P1, which is the only point from which the shortest distance SD between the first pixel PXL1 and the second pixel PXL2 is achieved. Compared with other points on the first planar shape SH1, the first point P1 faces (or protrudes toward) the second pixel PXL2, and is the closest point to the second pixel PIX2. By calculating the lengths of lines connecting every point on the first planar shape SH1 and every point on the second planar shape SH2, the first point P1 may be defined as a point at which the line representing the shortest distance SD touches the first planar shape SH1.

Since the first point P1 is the only point on the first planar shape SH1 from which the shortest distance SD is obtained, the length of a line connecting any other point than the first point P1 on the first planar shape SH1 and any point on the second planar shape SH2 is greater than the shortest distance SD. That is, because there are an infinite number of points on the second planar shape SH2, there are an infinite amount of distances from the first point P1 to the second planar shape SH2. In this case, one of these distances corresponds to the shortest distance SD between the first planar shape SH1 and the second planar shape SH2. Since the first point P1 is the only point from which the shortest distance SD is obtained, the distance from any other point than the first point P1 on the first planar shape SH1 to the second planar shape SH2 is greater than the shortest distance SD.

The first pixel PXL1 and the second pixel PXL2 may face each other in a point-to-point fashion, FIG. 6A, a point-to-line fashion FIG. 6B, a point-to-curve fashion FIG. 6C, a curve-to-line fashion FIG. 6D, or a curve-to-curve fashion FIG. 6E. That is, the first pixel PXL1 and the second pixel PXL2 do not face each other in a line-to-line fashion in which they run parallel to each other (as in FIG. 1).

The first point P1 may be a point on a straight line. Alternatively, the first point P1 may be a point on a curve. In the former case, the first pixel PXL1 and the second pixel PXL2 may be arranged as in FIGS. 6A to 6C. In the latter case, the first pixel PXL1 and the second pixel PXL2 may be arranged as in FIGS. 6D and 6E.

Figure 7A:
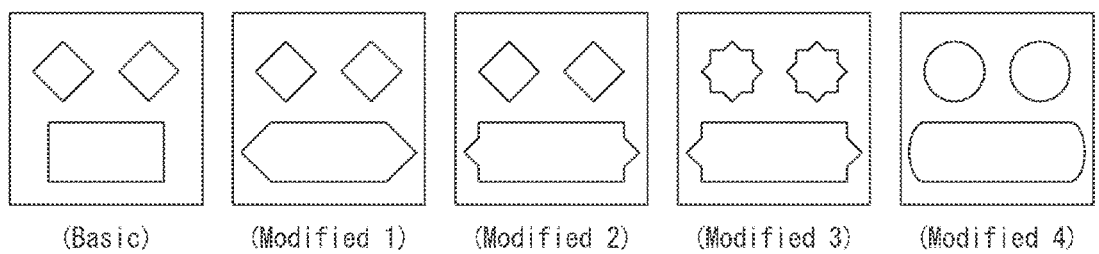
Figure 7B:
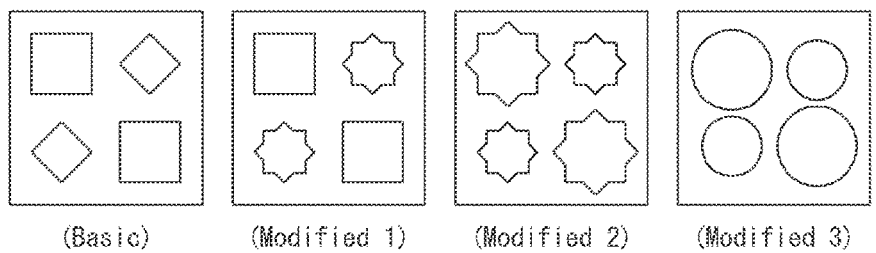

Referring to FIG. 7, the pixels PXL according to various exemplary embodiments of the present disclosure may be designed to satisfy the aforementioned conditions and have a planar shape over a large surface area, in order to improve aperture ratio. That is, FIGS. 7A and 7B is a view showing examples of how basic rectangular planar pixels PXL vary in shape in order to improve aperture ratio.

Referring to FIGS. 8A and 8B, the first planar shape SH1 and the second planar shape SH2 each may be bounded by lines consisting of points. One of the lines of the first planar shape SH1, that faces the second planar shape SH2 may be called a first line LN1. One of the lines of the second planar shape SH2, that faces the first planar shape SH1 may be called a second line LN2. If the first line LN1 is a straight line, a first imaginary line ILN1 extending from the first line LN1 and a second imaginary line ILN2 extending from the second line LN2 do not run parallel to each other but intersect.

In some instances, a first pixel PXL1 will have a shape as shown in FIG. 8B, in which there are two or more imaginary lines that extend from lines of the first shape SH1 towards the second pixel. In some instances, these will both cross an imaginary line extending from the second pixel, PXL2.

Figures 9A, 9B:
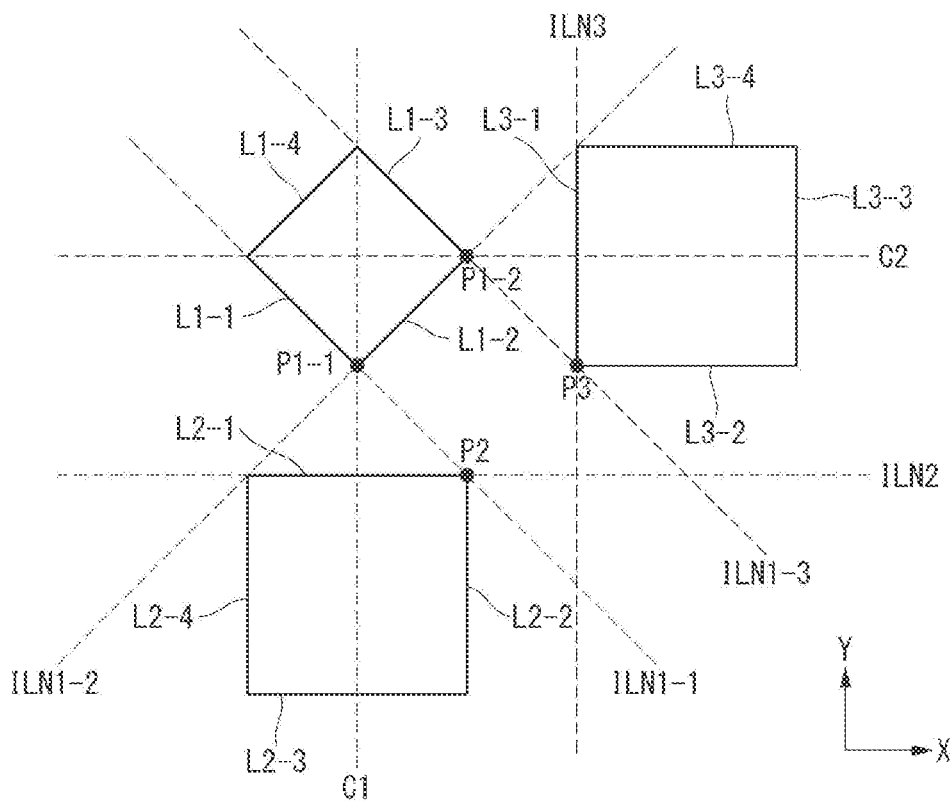

Referring to FIGS. 9A and 9B, second pixels PXL2 are adjacent to first pixels PXL1. Any two neighboring second pixels PXL2 may emit light of different colors than the first pixels PXL1. Suppose that the first pixels PL1 emit red light (R), the first pixel PXL1 and their neighboring second pixels PXL2 that emit green (G) or blue (B) light are arranged in such a way as to satisfy the aforementioned conditions. Suppose that the first pixels PL1 emit green light (G), the first pixels PXL1 and their neighboring second pixels PXL2 that emit red (R) or blue (B) light are arranged in such a way as to satisfy the aforementioned conditions. Suppose that the first pixels PL1 emit blue light (B), the first pixels PXL1 and their neighboring second pixels PXL2 that emit green (G) or red (R) light are arranged in such a way as to satisfy the aforementioned conditions.

In other words, the display panel DIS comprises a first pixel PXL1, a second pixel PXL2, and a third pixel PXL3. The third pixel PXL3 may be placed adjacent to the first pixel PXL1 and adjacent to the second pixel PXL2. The third pixel PXL3 may emit light of a different color from the first pixel PXL1 and the second pixel PXL2.

The first pixel PXL1 has a first planar shape SH1 consisting of a plurality of points. The second pixel PXL2 has a second planar shape SH2 consisting of a plurality of points. The third pixel PXL3 has a third planar shape SH3 consisting of a plurality of points. At least one of the first, second, and third planar shapes SH1, SH2, and SH3 may be different from another.

The first planar shape SH1 contains a first point P1, which is the only point from which the shortest distance SD between the first pixel PXL1 and the second pixel PXL2 is achieved, and a second point P2, which is the only point from which the shortest distance SD between the first pixel PXL1 and the third pixel PXL3 is achieved. By calculating the lengths of lines connecting every point on the first planar shape SH1 and every point on the second planar shape SH2, the first point P1 may be defined as a point at which the line representing the shortest distance SD touches the first planar shape SH1. By calculating the lengths of lines connecting every point on the first planar shape SH1 and every point on the third planar shape SH3, the second point P2 may be defined as a point at which the line representing the shortest distance SD touches the first planar shape SH1.

Since the first point P1 is the only point on the first planar shape SH1 from which the shortest distance SD is obtained, the length of a line connecting any other point than the first point P1 on the first planar shape SH1 and any point on the second planar shape SH2 is greater than the shortest distance SD between the first planar shape SH1 and the second planar shape SH2. Since the second point P2 is the only point on the first planar shape SH1 from which the shortest distance SD is obtained, the length of a line connecting any other point than the second point P2 on the first shape SH1 and any point on the third planar shape SH3 is greater than the shortest distance SD between the first planar shape SH1 and the third planar shape SH3.

In an example, the first pixel PXL1 may be a red (R) pixel PXL, the second pixel PXL2 may be a green (G) pixel PXL, and the third pixel PXL3 may be a blue (B) pixel PXL. In another example, the first pixel PXL1 may be a green (G) pixel PXL, the second pixel PXL2 may be a red (R) pixel PXL, and the third pixel PXL3 may be a blue (B) pixel PXL. In yet another example, the first pixel PXL1 may be a blue (B) pixel PXL, the second pixel PXL2 may be a green (G) pixel PXL, and the third pixel PXL3 may be a red (R) pixel PXL.

More specifically, the display panel DIS comprises a first pixel PXL1 and a second pixel PXL2. The first pixel PXL1 and the second pixel PXL2 emit light of different colors.

As shown in FIG. 9B, the first pixel PXL1 has a first planar shape SH1 containing a (1-1)th side L1-1, a (1-2)th side L1-2, a (1-3)th side L1-3, and a (1-4)th side L1-4. The second pixel PXL2 has a second planar shape SH2 containing a (2-1)th side L2-1, a (2-2)th side L2-2, a (2-3)th side L2-3, and a (2-4)th side L2-4. The (1-1)th side L1-1, (1-2)th side L1-2, (1-3)th side L1-3, and (1-4)th side L1-4 intersect the X and Y axes at a tilting angle (Dutch angle) θ. The tilting angle is an angle of tilt which is not vertical or horizontal. The (2-1)th side L2-1 and the (2-3)th side L2-3 are parallel to the X axis. The (2-2)th side L2-2 and the (2-4)th side L2-4 are parallel to the Y axis.

The (1-1)th side L1-1 and the (1-2)th side L1-2 face the (2-1)th side L2-1. A (1-1)th imaginary line ILN1-1 extending from the (1-1)th side L1-1 intersects a second imaginary line ILN2 extending from the (2-1)th side L2-1. A (1-2)th imaginary line ILN1-2 extending from the (1-2)th side L1-2 intersects the second imaginary line ILN2 extending from the (2-1)th side L2-1.

A (1-1)th point P1-1 at which the (1-1)th side L1-1 and the (1-2)th side L1-2 meet is a point from which the shortest distance between the first pixel PXL1 and the second pixel PXL2 is obtained. The (1-1)th point P1-1 faces the (2-1)th side L2-1. The (1-1)th point P1-1 may touch a first center line C1 perpendicular to the center of the (2-1)th side L2-1.

The display panel DIS further comprises a third pixel PXL3. The third pixel PXL3 emits light of a different color than the first and second pixels PXL1 and PXL2.

The second pixel PXL3 has a third planar shape SH3 containing a (3-1)th side L3-1, a (3-2)th side L3-2, a (3-3)th side L3-3, and a (3-4)th side L3-4. The (3-1)th side L3-1 and the (3-3)th side L3-3 are parallel to the Y axis. The (3-2)th side L3-2 and the (3-4)th side L3-4 are parallel to the X axis.

The (1-2)th side L1-2 and the (1-3)th side L1-3 face the (3-1)th side L3-1. The (1-2)th imaginary line ILN1-2 extending from the (1-2)th side L1-2 intersects the third imaginary line ILN3 extending from the (3-1)th side L3-1. The (1-3)th imaginary line ILN1-3 extending from the (1-3)th side L1-3 intersects the third imaginary line ILN3 extending from the (3-1)th side L3-1.

A (1-2)th point P1-2 at which the (1-2)th side L1-2 and the (1-3)th side L1-3 meet is a point from which the shortest distance between the first pixel PXL1 and the third pixel PXL3 is obtained. The (1-2)th point P1-2 faces the (3-1)th side L3-1. The (1-2)th point P1-2 may touch a second center line C2 perpendicular to the center of the (3-1)th side L3-1. The first center line C1 and the second center line C2 may intersect at right angles.

A second point P2 at which the (2-1)th side L2-1 and the (2-2)th side L2-2 meet is a point from which the shortest distance between the second pixel PXL2 and the third pixel PXL3 is obtained. A third point P3 at which the (3-1)th side L3-1 and the (3-2)th side L3-2 meet is a point from which the shortest distance between the second pixel PXL2 and the third pixel PXL3 is obtained. The second point P2 faces the third point P3. An imaginary line connecting the second point P2 and the third point P3 may run parallel to the (1-2)th L1-2 connecting the (1-1)th point P1-1 and the (1-2)th point P1-2.

Figure 10A:
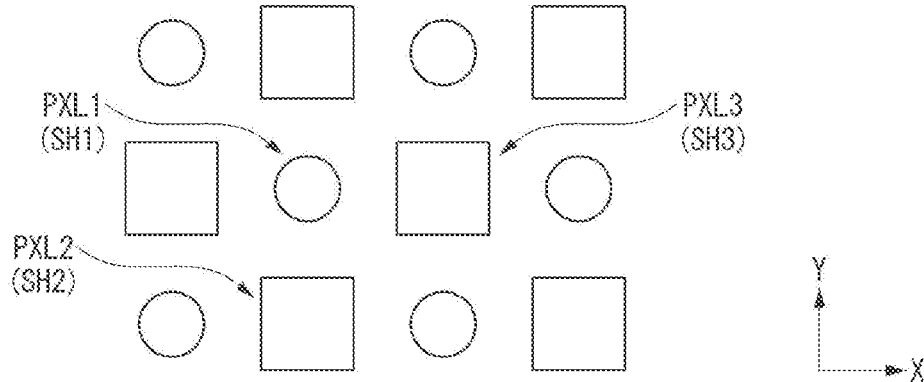
Figure 10B:
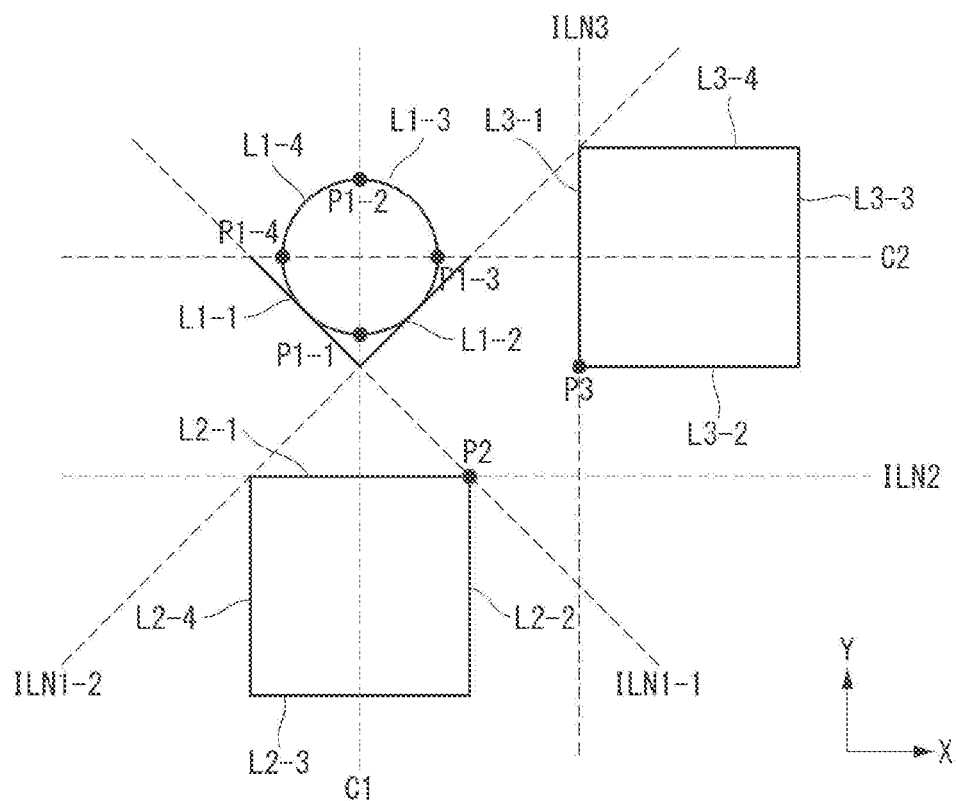

Referring to FIGS. 10A and 10B, the display panel DIS comprises a first pixel PXL1 and a second pixel PXL2. The first pixel PXL1 and the second pixel PXL2 emit light of different colors.

The first pixel PXL1 has a first planar shape SH1. The first planar shape SH1 may comprise a curve. A description will be given below of an example in which the first planar shape SH1 is a circle, but not limited thereto. The second pixel PXL2 has a second planar shape SH2 containing a (2-1)th side L2-1, a (2-2)th side L2-2, a (2-3)th side L2-3, and a (2-4)th side L2-4. The (2-1)th side L2-1 and the (2-3)th side L2-3 are parallel to the X axis. The (2-2)th side L2-2 and the (2-4)th side L2-4 are parallel to the Y axis. The (2-1)th side L2-1 is the closest side to the first pixel PXL1, and faces the first pixel PXL1.

The first planar shape SH1 consists of a plurality of points, and comprises a (1-1)th point P1-1, which is the closest point to the second pixel PXL2, and a (1-2)th point P1-2, which is the farthest point from the second pixel PXL2. A (1-1)th imaginary line ILN1-1 extending from the (1-1)th side L1-1, which is a tangent line to the first planar shape SH1 at any other point than the (1-1)th point P1-1 and the (1-2)th point P1-2, intersects a second imaginary line ILN2 extending from the (2-1)th side L2-1. Although not shown, if the first planar shape SH1 is not a circle, a plurality of (1-2)th points P1-2 may exist. A first center line C1 perpendicular to the center of the (2-1)th side L2-1 may pass through the center of the first planar shape SH1.

In other words, the first planar shape SH1 consists of a plurality of points, and comprises a (1-1)th point P1-1, which is the closest point to the second pixel PXL2. A (1-1)th imaginary line ILN1-1 extending from the (1-1)th side L1-1, which is a tangent line to the first planar shape SH1 at a point closest to the (1-1)th point P1-1, intersects the second imaginary line ILN2 extending from the (2-1)th side L2-1.

The display panel DIS further comprises a third pixel PXL3. The third pixel PXL3 emits light of a different color from the first and second pixels PXL1 and PXL2.

The second pixel PXL3 has a third planar shape SH3 containing a (3-1)th side L3-1, a (3-2)th side L3-2, a (3-3)th side L3-3, and a (3-4)th side L3-4. The (3-1)th side L3-1 and the (3-3)th side L3-3 are parallel to the Y axis. The (3-2)th side L3-2 and the (3-4)th side L3-4 are parallel to the X axis. The (3-1)th side L3-1 is the closest side to the first pixel PXL1, and faces the first pixel PXL1.

The first planar shape SH1 consists of a plurality of points, and comprises a (1-3)th point P1-3, which is the closest point to the third pixel PXL3, and a (1-4)th point P1-4, which is the farthest point from the third pixel PXL3. A (1-2)th imaginary line ILN1-2 extending from the (1-2)th side L1-2, which is a tangent line to the first planar shape SH1 at any other point than the (1-3)th point P1-3 and the (1-4)th point P1-4, intersects a third imaginary line ILN3 extending from the (3-1)th side L3-1. A second center line C2 perpendicular to the center of the (3-1)th side L3-1 may pass through the center of the first planar shape SH1. The first center line C1 and the second center line C2 may intersect at right angles.

In other words, the first planar shape SH1 consists of a plurality of points, and comprises a (1-3)th point P1-3, which is the closest point to the third pixel PXL3. A (1-2)th imaginary line ILN1-2 extending from the (1-2)th side L1-2, which is a tangent line to the first planar shape SH1 at a point closest to the (1-3)th point P1-3, intersects the third imaginary line ILN3 extending from the (3-1)th side L3-1.

A second point P2 at which the (2-1)th side L2-1 and the (2-2)th side L2-2 meet is a point from which the shortest distance between the second pixel PXL2 and the third pixel PXL3 is obtained. A third point P3 at which the (3-1)th side L3-1 and the (3-2)th side L3-2 meet is a point from which the shortest distance between the second pixel PXL2 and the third pixel PXL3 is obtained. The second point P2 faces the third point P3.

FIG. 11 is an explanatory diagram showing by comparison the effects of an organic light-emitting diode display device according to an exemplary embodiment of the present disclosure.

Figure 11A:
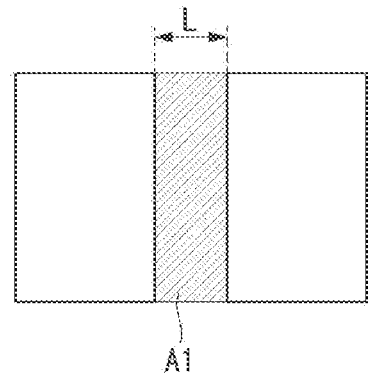
FIGS. 11A, 11B, and 11C are explanatory diagrams showing by comparison the effects of an organic light-emitting diode display device according to an exemplary embodiment of the present disclosure.
Figure 11B:
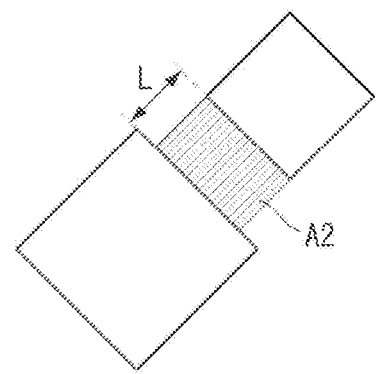
Figure 11C:
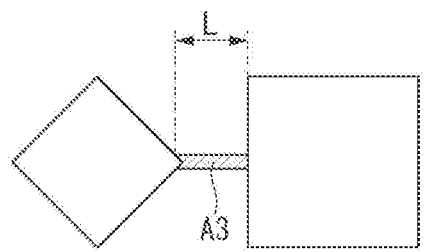

FIGS. 11A and 11B show pixel structures PXL according to comparative examples. FIG. 11C shows a pixel arrangement structure PXL according to an exemplary embodiment of the present disclosure.

Suppose that the shortest distance L between neighboring pixels PXL is constant, the structure disclosed in FIG. 11C may significantly reduce leakage current, compared with the structures disclosed in FIGS. 11A and 11B. Specifically, the space between neighboring pixels PXL may be a leakage current path. However, it should be noted that, if the distance between neighboring pixels PXL varies with position, the actual leakage current path is the shortest distance L between the neighboring pixels PXL.

In view of this, the area A3 occupied by the leakage current path in the structure shown in FIG. 11C is much smaller than the areas A1 and A2 occupied by the leakage current paths in the structures shown in FIGS. 11A and 11B. Thus, the structure shown in FIG. 11 C has a relatively high resistance in the leakage current path, compared with the structures shown in FIGS. 11A and 11B, thereby effectively suppressing the flow of leakage current.

The present disclosure may reduce color mixing caused by leakage current by suppressing the flow of leakage current. Accordingly, the present disclosure may provide an organic light-emitting diode display device that significantly improves color reproduction and enhances the display quality of high-resolution displays.

First Example of Application

Figure 12:
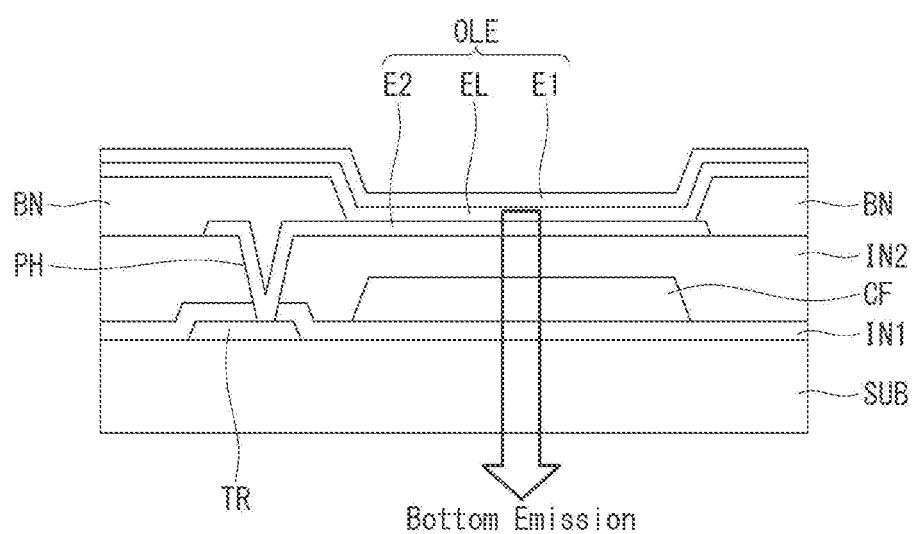
FIG. 12 is a cross-sectional view schematically showing a pixel structure for an organic light-emitting diode display device according to a first example of application of the present disclosure.

FIG. 12 is a cross-sectional view schematically showing a pixel structure for an organic light-emitting diode display device according to a first example of application of the present disclosure.

Referring to FIG. 12, the organic light-emitting diode display device according to the first example of application of the present disclosure comprises a thin-film transistor substrate SUB. A thin-film transistor TR allocated to each pixel and an organic light-emitting diode OLE connected to the thin-film transistor TR are placed on the thin-film transistor substrate SUB. Neighboring pixels may be sectioned off by a bank BN.

The thin-film transistor TR may have various structures such as a bottom-gate structure and a top-gate structure. One or more insulating films IN1 and IN2 may be sandwiched between the thin-film transistor TR and the organic light-emitting diode OLE. The thin-film transistor TR and the organic light-emitting diode OLE may be electrically connected via a pixel contact hole PH formed in the one or more insulating films IN1 and IN2.

The organic light-emitting diode OLE comprises first and second electrodes E1 and E2 facing each other, and an organic emission layer EL sandwiched between the first electrode E1 and the second electrode E2. The first node E1 may be an anode, and the second electrode E2 may be a cathode. However, the organic light-emitting diode OLE is not limited to this but may have an inverted structure. The organic emission layer EL may be integrally formed on the pixels to extend and cover most of the thin-film transistor SUB.

The organic light-emitting diode display device according to the first example of application may be implemented as bottom-emission type. To this end, a color filter CF is placed under the organic light-emitting diode OLE. Light produced from the organic emission layer EL is emitted in the direction of the thin-film transistor substrate SUB through the color filter CF.

Second Example of Application

Figure 13:
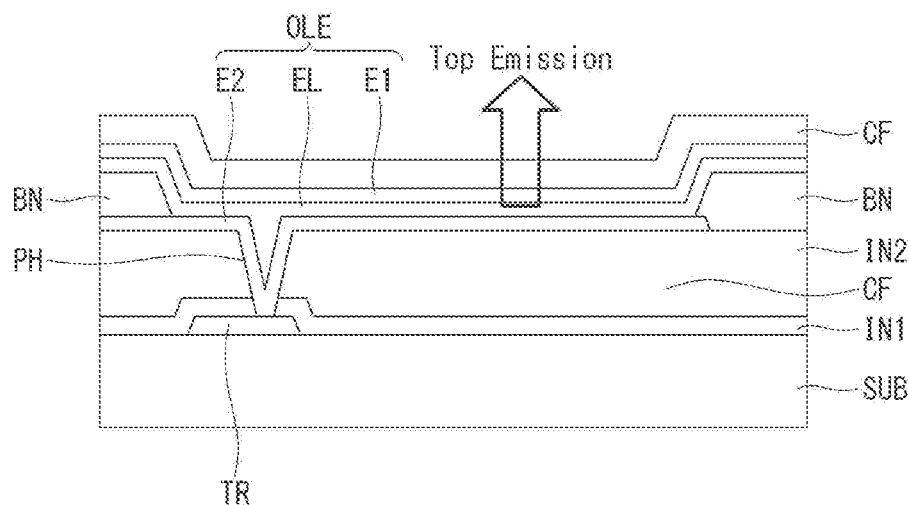
FIG. 13 is a cross-sectional view schematically showing a pixel structure for an organic light-emitting diode display device according to a second example of application of the present disclosure.

FIG. 13 is a cross-sectional view schematically showing a pixel structure for an organic light-emitting diode display device according to a second example of application of the present disclosure.

Referring to FIG. 13, the organic light-emitting diode display device according to the second example of application of the present disclosure comprises a thin-film transistor substrate SUB. A thin-film transistor TR allocated to each pixel and an organic light-emitting diode OLE connected to the thin-film transistor TR are placed on the thin-film transistor substrate SUB. Neighboring pixels may be sectioned off by a bank BN.

The thin-film transistor TR may have various structures such as a bottom-gate structure and a top-gate structure. One or more insulating films IN1 and IN2 may be sandwiched between the thin-film transistor TR and the organic light-emitting diode OLE. The thin-film transistor TR and the organic light-emitting diode OLE may be electrically connected via a pixel contact hole PH formed in the one or more insulating films IN1 and IN2.

The organic light-emitting diode OLE comprises first and second electrodes E1 and E2 facing each other, and an organic emission layer EL sandwiched between the first electrode E1 and the second electrode E2. The first node E1 may be an anode, and the second electrode E2 may be a cathode. However, the organic light-emitting diode OLE is not limited to this but may have an inverted structure. The organic emission layer EL may be integrally formed on the pixels to extend and cover most of the thin-film transistor SUB.

The organic light-emitting diode display device according to the second example of application may be implemented as top-emission type. To this end, a color filter CF is placed over the organic light-emitting diode OLE. Light produced from the organic emission layer EL is emitted in the opposite direction of the thin-film transistor substrate SUB through the color filter CF.

Third Example of Application

Figure 14:
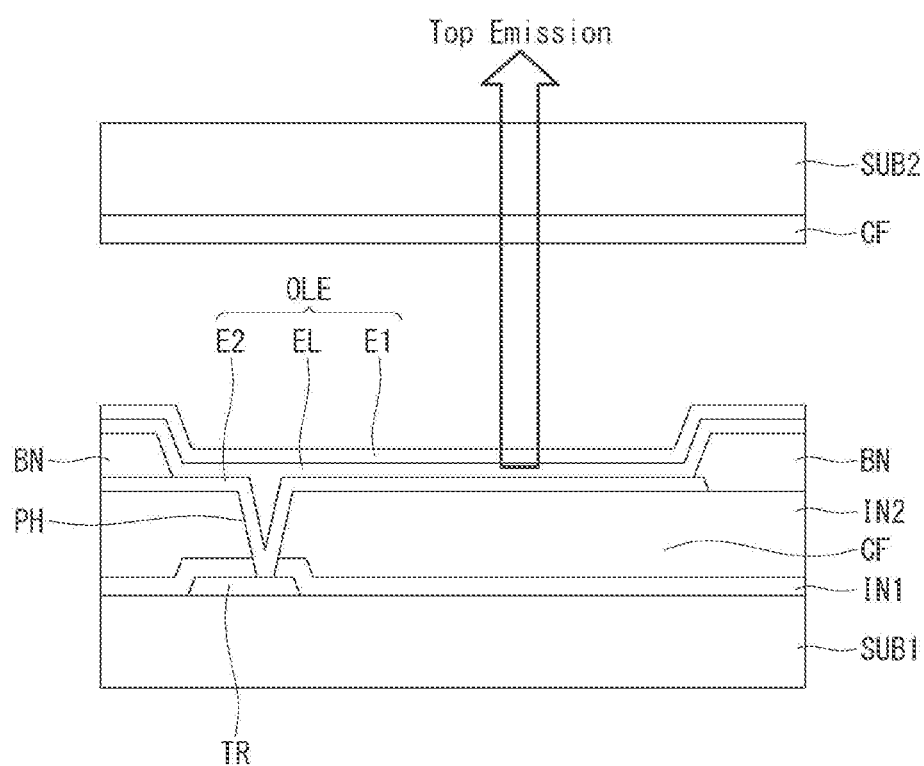
FIG. 14 is a cross-sectional view schematically showing a pixel structure for an organic light-emitting diode display device according to a third example of application of the present disclosure.

FIG. 14 is a cross-sectional view schematically showing a pixel structure for an organic light-emitting diode display device according to a third example of application of the present disclosure.

Referring to FIG. 14, the organic light-emitting diode display device according to the third example of application of the present disclosure comprises a thin-film transistor substrate SUB1 and a color filter substrate SUB2 that are located opposite each other. A thin-film transistor TR allocated to each pixel and an organic light-emitting diode OLE connected to the thin-film transistor TR are placed on the thin-film transistor substrate SUB1. Neighboring pixels may be sectioned off by a bank BN.

The thin-film transistor TR may have various structures such as a bottom-gate structure and a top-gate structure. One or more insulating films IN1 and IN2 may be sandwiched between the thin-film transistor TR and the organic light-emitting diode OLE. The thin-film transistor TR and the organic light-emitting diode OLE may be electrically connected via a pixel contact hole PH formed in the one or more insulating films IN1 and IN2.

The organic light-emitting diode OLE comprises first and second electrodes E1 and E2 facing each other, and an organic emission layer EL sandwiched between the first electrode E1 and the second electrode E2. The first node E1 may be an anode, and the second electrode E2 may be a cathode. However, the organic light-emitting diode OLE is not limited to this but may have an inverted structure. The organic emission layer EL may be integrally formed on the pixels to extend and cover most of the thin-film transistor SUB.

The organic light-emitting diode display device according to the third example of application may be implemented as top-emission type. To this end, a color filter CF is placed on the color filter substrate SUB2 located opposite the thin-film transistor substrate SUB1. Light produced from the organic emission layer EL is emitted in the direction of the color filter substrate SUB2 through the color filter CF.

Through the above description, those skilled in the art will appreciate that various modifications and changes are possible, without departing from the scope and spirit of the disclosure. Therefore, the technical scope of the present disclosure should be defined by the appended claims rather than the detailed description of the specification.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting diode display device comprising a display panel where X and Y axes intersecting each other are defined, the display panel comprising:
   a first pixel having a first planar shape containing a (1-1)th side, a (1-2)th side, a (1-3)th side, and a (1-4)th side that intersect the X and Y axes; and
   a second pixel having a second planar shape containing a (2-1)th side and a (2-3)th side that are parallel to the X axis and a (2-2)th side and a (2-4)th side that are parallel to the Y axis,
   a third pixel having a third planar shape containing a (3-1)th side and a (3-3)th side that are parallel to the Y axis and a (3-2)th side and a (3-4)th side that are parallel to the X axis
   wherein the (1-1)th side and the (1-2)th side face the (2-1)th side,
   wherein a (1-1)th imaginary line extending from the (1-1)th side and a (1-2)th imaginary line extending from the (1-2)th side intersect a second imaginary line extending from the (2-1)th side,
   wherein the (1-2)th side and the (1-3)th side face the (3-1)th side, and the (1-2)th imaginary line and a (1-3)th imaginary line extending from the (1-3)th side intersect a third imaginary line extending from the (3-1)th side,
   wherein a (1-1)th point at which the (1-1)th side and the (1-2)th side meet is a point from which the shortest distance between the first planar shape and the second planar shape is obtained,
   a (1-2)th point at which the (1-2)th side and the (1-3)th side meet is a point from which the shortest distance between the first planar shape and the third planar shape is obtained,
   a second point at which the (2-1)th side and the (2-2)th side meet is a point from which the shortest distance between the second planar shape and the third planar shape is obtained,
   a third point at which the (3-1)th side and the (3-2)th side meet is a point from which the shortest distance between the second planar shape and the third planar shape is obtained, and
   wherein the (1-1)th point touches a first center line perpendicular to the center of the (2-1)th side, and the (1-2)th point touches a second center line perpendicular to the center of the (3-1)th side.

2. The organic light-emitting diode display device of claim 1, wherein the first pixel, the second pixel, and the third pixel emit light of different colors.

* * * * *